United States Patent [19]
Edwards et al.

[11] Patent Number: 5,271,019
[45] Date of Patent: Dec. 14, 1993

[54] SCANNABLE SYSTEM WITH ADDRESSABLE SCAN RESET GROUPS

[75] Inventors: Robert Edwards, San Jose; Jeffrey Techau; Rita Rudolph, both of Sunnyvale, all of Calif.

[73] Assignee: Amdahl Corporation, Sunnyvale, Calif.

[21] Appl. No.: 670,289

[22] Filed: Mar. 15, 1991

[51] Int. Cl.⁵ .................................... G01R 31/318
[52] U.S. Cl. ............................ 371/22.3; 307/272.3
[58] Field of Search .................. 371/22.3; 307/272.3

[56] References Cited

U.S. PATENT DOCUMENTS

| | | | |
|---|---|---|---|
| 3,761,695 | 9/1973 | Eichelberger | 371/22.3 |
| 3,784,907 | 1/1974 | Eichelberger | 371/62 X |
| 3,924,144 | 12/1975 | Hadamard | 307/303 |
| 3,961,254 | 6/1976 | Cavaliere et al. | 371/22.3 |
| 4,342,084 | 7/1982 | Sager et al. | 395/575 |
| 4,488,259 | 12/1984 | Mercy | 364/900 |
| 4,597,042 | 6/1986 | D'Angeac et al. | 371/22.3 |
| 4,697,267 | 9/1987 | Wakai | 371/22.3 |
| 5,054,024 | 10/1991 | Whetsel | 371/22.3 |
| 5,056,094 | 10/1991 | Whetsel | 371/25.1 |
| 5,155,856 | 10/1992 | Bock et al. | 395/800 |

FOREIGN PATENT DOCUMENTS 382184  8/1990  European Pat. Off. ........... 371/22.3

OTHER PUBLICATIONS

Ando, H., "Testing VLSI with Random Access Scan", *The Proceedings of COMPCON Spring '80*, Feb. 1980, pp. 50-52.

Uyemura, J., *Fundamentals of MOS Digital Integrated Circuits*, Addison-Wesley Pub. Co., 1988, pp. 601-605.

Author unknown, "Shift Register Latch for Delay Testing", *IBM Tech. Discl. Bull.*, vol. 32, No. 4A, Sep. 1989, pp. 231-232.

*Primary Examiner*—Stephen M. Baker

[57] ABSTRACT

A set of scan latches is partitioned into unique groups where each group is addressable by a group initializing circuit. The group initializing circuit initializes all the latches of an addressed group to a predefined state thereby quickly loading a test vector into the addressed group of scan latches while leaving other latches undisturbed.

38 Claims, 5 Drawing Sheets

SCANNABLE SYSTEM WITH ADDRESSABLE SCAN RESET GROUPS

BACKGROUND OF THE INVENTION

The invention relates to scan testing of digital circuitry, particularly in a concurrently running computer.

2. Background

A computer system which is able to continue operating even when faults occur in a subcomponent is highly desirable in a variety of situations. By way of example, a large corporation may have all its activities controlled by a central computer system. Such a corporation can ill afford to suffer complete system shutdown because of a fault in a minor subcomponent of the system. If one part of the computer system fails, other parts should continue to be available for productive operations. The failed part should be structured for quick fault isolation and repair so that it can be rapidly brought back on line after a failure. And to prevent unexpected failures from occurring in the first place, mechanisms should be provided in each part of the computer system for performing routine maintenance, error logging and fault elimination.

Scan testing subsystems are one type of mechanism by which otherwise difficult-to-access components within a complex system of computer or other digital circuits can be accessed and their states detected and altered to detect and/or correct functional errors. Examples of scan test structures and their uses may be found in the following U.S. Patents: (A) U.S. Pat. No. 4,244,019, DATA PROCESSING SYSTEM INCLUDING A PROGRAM-EXECUTING SECONDARY SYSTEM CONTROLLING A PROGRAM-EXECUTING PRIMARY SYSTEM, issued to Anderson et al, Jan. 6, 1981; (B) U.S. Pat. No. 4,752,907, INTEGRATED CIRCUIT SCANNING APPARATUS HAVING SCANNING DATA LINES FOR CONNECTING SELECTED DATA LOCATIONS TO AN I/O TERMINAL, issued to Si, et al. Jun. 21, 1988; and (C) U.S. Pat. No. 4,819,166, MULTI-MODE SCAN APPARATUS, issued to Si et al Apr. 4, 1989. U.S. Pat. No. 4,661,953, ERROR TRACKING APPARATUS IN A DATA PROCESSING SYSTEM, issued to Venkatesh et al, Apr. 28, 1987 discloses an error history logging method whose relevance to the present application will be seen below. The disclosures of these patents are incorporated here by reference.

A scan testing subsystem is typically formed by defining a set of uniquely addressable scan points (e.g., $SP_{001}$, $SP_{002}$, $SP_{003}$, etc.) located at preselected parts inside of a system to be tested. The system to be tested (hereafter also System Under Test or SUT) typically includes one or more circuits whose internal nodes are not easily accessed. By way of example, each such circuit can be an integrated circuit (IC) chip which has been packaged such that direct connection to internal components of the IC chip is no longer possible. By way of further example, each such circuit can be mounted on a printed circuit board which has been conformably coated and/or inserted into a chassis such that it is no longer convenient to make direct connection to wires of the board for test purposes.

To access the internal nodes of such systems, scan point reading means are provided for uniquely addressing each scan point (hereafter, $SP_{xyz}$, where "x" "y" and "z" are arbitrary identifiers) within the system under test (SUT). The reading means detects the state of an addressed scan point, $SP_{xyz}$, and relays the detected state to a point external of the SUT so that the state of the addressed point can be studied.

If a scan point ($SP_{xyz}$) is driven either directly or indirectly by a bistable latch, then scan point driving means are also provided for addressing that latch, forcing it into a predetermined state (usually the logic high or "set" state ("1")) and thereby driving its corresponding scan point ($SP_{xyz}$) into a responsive state. A latch which drives a scan point ($SP_{xyz}$) either directly or indirectly is referred to here as a scan latch and denoted by $SL_{xyz}$.

In a conventional scan testing procedure, every scan latch ($SL_{xyz}$) in the system under test (SUT) is disabled from responding to signals presented at a normal data input terminal (D) of that latch. This is usually done by disabling a clock distribution line which supplies clock pulses to all the scan latches ($SL_{xyz}$). The data output terminal (Q) of each scan latch ($SL_{xyz}$) can be forced to a logic one state ("1"), even though the latch is not being clocked, by applying a logic "1" to a set terminal (SET) of the latch. The data output terminal (Q) can be forced to a logic zero state "0" by applying a logic "1" to an opposing reset terminal (RST) of the scan latch ($SL_{xyz}$). The forced state propagates from the output terminal (Q) to a circuit of interest within the system under test (SUT) and the response of the circuit to such stimulus is detected at an appropriate scan point.

When the system under test (SUT) is a high density one which is implemented on a circuit supporting substrate of limited area, e.g., on the semiconductor substrate of an IC chip, then a single addressing circuit is preferably used to simultaneously identify each scan point ($SP_{xyz}$) whose state is to be read and to identify each scan latch ($SL_{xyz}$) whose state may have to be forced to a predetermined first state (usually the "1" state). This simultaneous addressing approach is taken to minimize the amount of circuitry used for the scan point reading and scan latch setting functions. The limited area of the circuit supporting substrate (e.g., IC chip substrate) is thereby conserved for implementing other functions.

Scan functions are used primarily for test purposes and only rarely to support normal circuit functions. Accordingly, from the view point of normal circuit functionality, the scan-implementing circuitry is considered undesirable overhead and the conventional philosophy is to implement the scan testing functions with as little circuitry as possible.

In keeping with this philosophy, no means is provided within a conventional scan subsystem for forcing each scan latch ($SL_{xyz}$) individually into an opposed second state (i.e., the "0" state) after it has been addressed by the single addressing means and forced into the first state (the "1" state). Instead, a global reset line which connects to all the scan latches ($SL_{xyz}$) is activated to simultaneously force them all into the second state ("0"). Then, those particular scan latches which need to be placed in the first state ("1") are individually addressed, one at a time, by the single addressing means and forced into the first state ("1").

Thus, all the scan latches are addressed in parallel as a unitary body when the state of one or more scan latches has to be switched from a logic "1" to a logic "0". Each scan latch is thereafter individually and serially addressed if its state is to be conversely switched from a logic "0" to a logic "1". Any combination of logic ones and zeroes (1's and 0's) can be loaded into an array of scan latches with this technique. Each combination of 1's and 0's to-be-loaded into all the scan latches of a system under test (SUT) is referred to here as a complete test vector. A shorter sequence of 1's and 0's inside of a complete test vector is referred to here as a test vector subsequence.

A disadvantage of the above described technique comes to light when a single bit of an already-loaded and relatively-long (i.e. 100 bits long) test vector has to be changed from a logic "1" to a logic "0" while all other bits are to remain unchanged. Before a global reset command is issued, the state of the complete test vector has to be preserved by storing a copy of it in a random access memory (RAM) or other data storage device which is external to the system under test (SUT). If the system under test has one or more VLSI (Very-Large Scale Integration) chips and each VLSI chip has 512 or more scan latches defined within its circuitry then the 512 or more scan latches of each VLSI chip will have to be addressed, one at a time, to detect their current states and the detected states will have to be preserved in external RAM or some other data storage medium. The global reset line is thereafter activated to clear all the scan latches. The state of the one bit to be changed is toggled within the external RAM device. And the contents of the external RAM device are then reloaded into the scan latches of the SUT by addressing each scan latch ($SL_{xyz}$) which is to contain a logic "1", one at a time, and forcing it into the "1" state through its SET terminal.

Given the high storage densities and high bit rates of modern logic circuits, it is not considered a problem to maintain a copy of some 512 bits in an external RAM (or a relatively low multiple of 512, such as 1024 or 2048 bits), to edit some of these bits and to shuffle all the bits back into the scan latches of a system under test (SUT) every time the complete test vector of the SUT has to be changed. But this assumes that the SUT comprises one or perhaps just a few VLSI chips. Some types of systems to be tested (SUT's) have hundreds of VLSI chips. A complete test vector for such SUT's may contain millions of bits and such SUT's may require thousands or millions of different test vectors to be applied to each chip all within a limited time span.

High-performance computers such as an IBM or Amdahl mainframe are examples of such test-intensive systems. Testing has to be performed in reasonable time and typically, a same pattern of test vectors has to be loaded repeatedly, many times during the life of the system. So the amount of time consumed by a too-slow test-vector loading procedure disadvantageously accumulates over the life of the computer.

One impediment to faster testing is the inherent delay in above-mentioned technique for changing the complete test vector within the SUT. The global reset command switches the states of all scan latches in one step. But thereafter, the scan latches are reloaded with logic "1's" one at a time using a serial addressing scheme. When the system under test (SUT) comprises many and/or a relatively complex set of VLSI chips, it can take an undesirably long time to serially load each bit of each test vector again and again into each scan latch after every global reset. It would be advantageous to have a mechanism whereby one could quickly change a test vector at a few points of interest inside a large machine without having to preserve the states of all the scan latches in an external RAM device and without having to reload all the scan latches of the machine just so that a slightly altered test vector can be tried.

SUMMARY OF THE INVENTION

According to the invention, the scan latches of a system under test (SUT) are divided into groups of preferably two or more scan latches each. If there are more than two groups, a few of the groups may constitute just one scan latch each. A predefined one of the groups is addressed by a group switch command such that the scan latches of the addressed group switch in unison to a predefined state thereby loading a predefined test vector subsequence into the latches of the addressed group. The latches of the addressed group can be addressed individually thereafter to modify the test vector subsequence.

In accordance with one aspect of the invention, a set of scan latches included within an integrated circuit (IC) chip is divided to define a plurality of unique latch groups including mutually exclusive or overlapping reset groups. When a switch command is issued to a reset group, all the latches of that group reset to a logic "0" state in unison. Each reset or other latch group preferably comprises two or more scan latches. If there are more than a few groups, some of the groups may contain just one latch.

Each group is assigned a unique address and it is connected to a group addressing and initializing circuit also include within the IC chip. When activated, the group initializing circuit simultaneously initializes all the latches of an addressed latch group, forces the latches of the group to a predefined initial state, and thus automatically loads a predefined test vector subsequence into the latches of the addressed group, or alternatively; places the latches of the addressed group in a state which allows a desired test vector subsequence to be quickly loaded into those latches immediately thereafter. The states of latches not belonging to the addressed group remain unaffected by the initialization step.

One embodiment of the invention features an address decoder which receives n address bits and decodes these to define an address space having $N=2^n$ locations. A majority of these N locations are dedicated for scan-point reading and scan-latch setting functions while a minority of the locations are dedicated to group initialization functions.

The decoder outputs an address designating signal on one of a plurality of address-designating lines in response to a received n-bit long address signal placed on its address input lines. The address-designating lines cross with a plurality of logic-gate input lines to define an initialization-group assignment grid. Each of the logic-gate input lines connects to the input terminal of one of a plurality of logic gates. Each of these logic gates has an output terminal which connects to a reset or set terminal of one or more scan latches.

Interconnections are made between the crossing lines of the assignment grid for assigning each scan latch to one or more unique latch groups. When the latch group is addressed by an n-bit wide address signal supplied to the decoder, all latches of the addressed group are simultaneously initialized (set or reset) in accordance with the interconnections made in the group-assignment grid.

The number of address-designating lines, M, in the initialization-group assignment grid is preferably a small fraction, M/N, of the N address locations which can be addressed by the decoder. The fraction, M/N, is preferably in the range 8/1024 to 64/1024, and more preferably in the range 15/1024 to 32/1024.

In accordance with a further aspect of the invention, general-purpose and special-purpose groups are defined. A general-purpose latch group contains all scan latches whose addresses fall within a predefined address range. Different general purpose groups correspond to different ranges. Every latch within a scan-testable machine is preferably assigned to at least one general-purpose group so that each scan latch, regardless of its particular function, can be quickly initialized by addressing its general-purpose latch group.

Each special-purpose latch group contains scan latches which are functionally interrelated. By way of example, a first special purpose group contains a plurality of scan latches which function together to define a data register or counter within the system under test. The register or counter is placed in a predefined state (e.g., the reset state) by addressing its latches collectively as a group and initializing the group in one step. A second special purpose group includes one or more so-called, clock-suppressing OSL's (Operating State Latches). Each of these clock-suppressing OSL's can be set or reset to selectively enable or suppresses the transmission of clock signals to some but not all scan latches within a single IC chip. By resetting just a predefined group of the clock-suppressing OSL's while keeping others of these OSL's set, it is possible to distribute system clocks through an IC chip such that one part of the IC chip can continue to run uninterrupted while a second part of the same chip is scanned. Other special-purpose groups and further aspects of the invention will become apparent from the detailed description provided below.

BRIEF DESCRIPTION OF THE DRAWINGS

The invention is described with reference to the following figures in which.

DETAILED DESCRIPTION

Figure 1A:
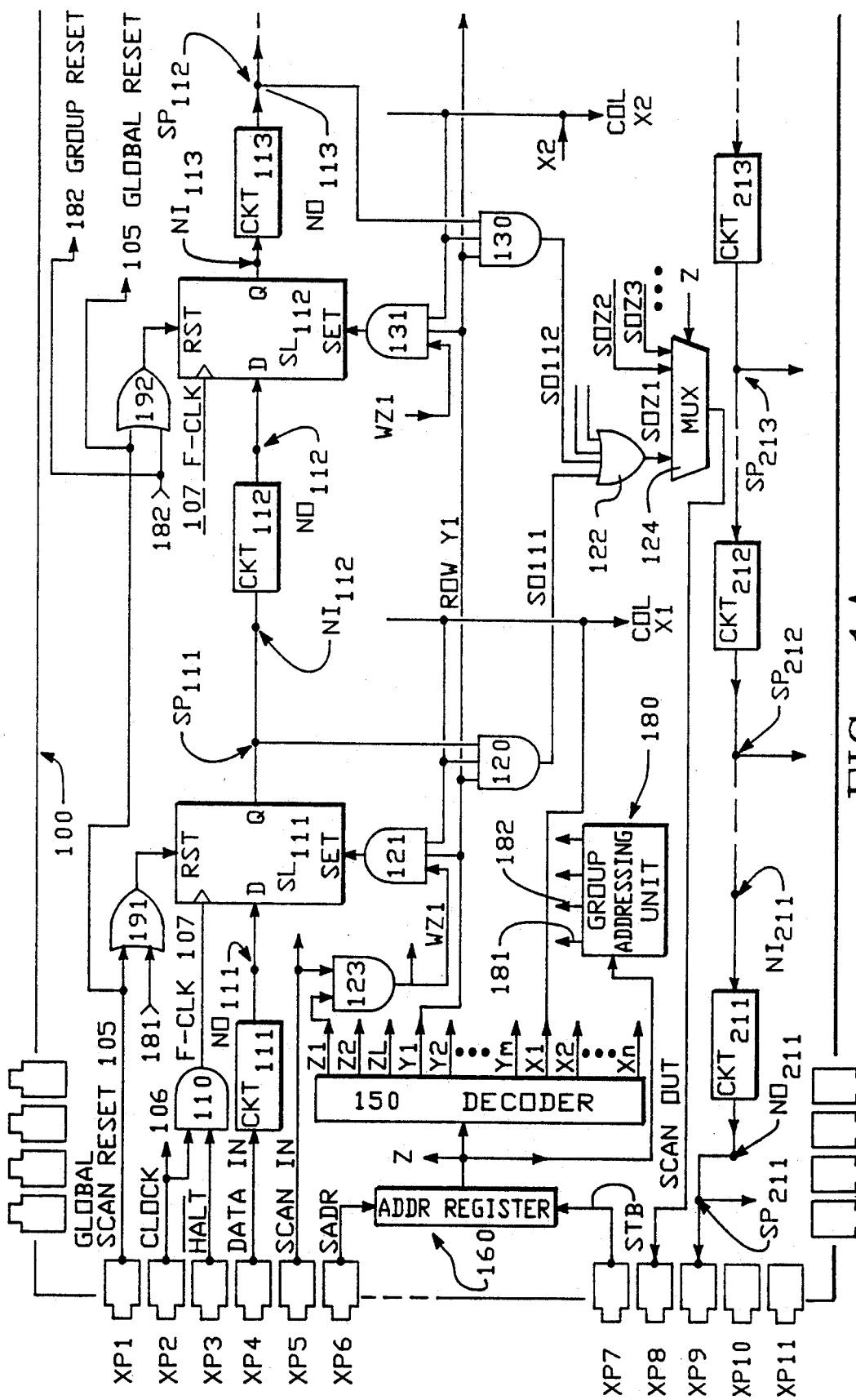
FIG. 1A is a schematic diagram of a first, integrated circuit chip to be tested and an on-chip scan testing subsystem which is distributed through subcircuits of the to-be-tested IC in accordance with the invention.

FIG. 1A shows a first integrated circuit (IC) chip 100 to be tested (hereafter also System Under Test, or SUT for short). The chip 100 is provided with external connection points, XP1, XP2, XP3, etc., which couple internal parts of the chip to external circuits. Some internal parts of the chip 100 are conceptually incorporated into an array of subcircuits, $CKT_{111}$, $CKT_{112}$, $CKT_{113}$, ..., $CKT_{211}$, $CKT_{212}$, $CKT_{213}$, ..., $CKT_{zyx}$. Subscripts "z", "y" and "x" represent arbitrary designators which are referred to here respectively as the plane-number, the row-number and the column-number. The "x" and "y" subscripts can represent the physical column and row location of a particular subcircuit $CKT_{zyx}$ on the surface of an IC chip, although they do not have to. Two subcircuits can be positioned close to one another and yet participate in completely unrelated operations. This is where the "z" identifier comes to play. It can be thought of as identifying a conceptual plane of operation rather than a physical location.

Each subcircuit $CKT_{zyx}$ of FIG. 1A can be a combinatorial network of logic gates (AND, OR, NOT, etc.) or some other logic circuit through which logic signals propagate. A subcircuit $CKT_{zyx}$ is defined to have at least one input node, $NI_{zyx}$, for receiving a stimulus signal and at least one output node, $NO_{zyx}$, for outputting a responsive output signal.

Conductive nets (e.g., wires) link each respective input node $NI_{abc}$ to an output node $NO_{def}$ or to one of the external points XPi on the chip 100 to thereby define one or more functional circuits on the IC chip 100 (a, b, c, d, e, f and i are arbitrary designators here).

In the example illustrated by FIG. 1A, a first subcircuit $CKT_{111}$ is shown receiving a stimulus signal (DATA IN) from external connection point XP4 and outputting a responsive signal to corresponding output node $NO_{111}$. This output signal passes through a first latch $SL_{111}$ during a normal operating mode, and it is applied to an input node $NI_{112}$ of a succeeding subcircuit $CKT_{112}$. Latch SL is clocked by a clock signal applied at XP2 during the normal operating mode. The second subcircuit $CKT_{112}$ outputs a responsive signal onto node $NO_{112}$ and this signal normally passes through a second latch $SL_{112}$ for application to input node $NI_{113}$ of a third subcircuit $CKT_{113}$.

A broken line indicates that the signal forwarding chain of FIG. 1A continues from output node $NO_{113}$ of the third subcircuit $CKT_{113}$ deeper into the chip 100. The remainder of the chip is not shown. A signal return chain extending back into the shown part from an unshown part of the chip is illustrated to comprise subcircuit $CKT_{213}$, subcircuit $CKT_{212}$ and subcircuit $CKT_{211}$ connected in series. The latter subcircuit outputs a signal to external connection point $XP_9$.

It is to be understood that FIG. 1A merely shows an example of a circuit network which could be defined inside chip 100 and that a typical chip will contain more complex series/parallel networks.

When chip 100 is in the normal operating mode, many signals are simultaneously passing inside from one subcircuit $CKT_{abc}$ to another subcircuit $CKT_{def}$ and rapidly changing the overall "state" of the chip 100 (a,b,c, ..., f are arbitrary designators here). If an operational fault occurs somewhere deep inside the chip 100, the logic states at the external input and output points ($XP_4$ and $XP_9$) may not provide enough information to either reveal the existence of the fault or explain why it occurred.

It is often desirable to obtain one or more snapshots of the chip's internal states just as the fault is evolving (this is referred to as error history logging), to isolate relevant subcircuits of the chip from one another and to toggle various nodes within the chip 100 so that the cause of the fault can be more easily located and/or remedied.

FIG. 1A shows that a plurality of scan points ($SP_{zyx}$) are defined at various locations within chip 100. Scan point ($SP_{111}$) for example, is positioned to detect the Q output state of latch $SL_{111}$. Scan point ($SP_{112}$) is positioned to detect the output state of subcircuit $CKT_{113}$. The latches, $SL_{111}$ and $SL_{112}$, which are inserted into the circuit nets of chip 100 at various locations serve as scan latches (and they are represented generically here by the notation, $SL_{zyx}$).

Each scan latch ($SL_{zyx}$) has a D input terminal for receiving data, internal storage means (not shown) for storing data and a Q output terminal for outputting the stored data. Data applied at the D input terminal of the scan latch ($SL_{zyx}$) is loaded into its internal storage means when a clock pulse is detected at a clock input terminal (>) of the latch. Each scan latch ($SL_{zyx}$) also has SET and RST terminals for respectively setting the state of its stored data to a logic "1" or resetting it to a logic "0" irrespective of the data on the D input terminal.

A global scan reset line (GLOBAL SCAN RESET 105) is shown coupling a first external connection point XP1 to the RST terminals of all scan latches so that all the scan latches can be reset in one step. It will be seen later that this global reset line 105 and its associated external connection point XP1 can be eliminated in accordance with one embodiment of the invention, or its function can be modified to create a non-addressed special-purpose reset group in accordance with another embodiment of the invention, but it is easier to appreciate the invention by first considering an IC chip which includes a global scan reset line 105.

A clock signal is transmitted into the chip 100 through connection point XP2 and it is distributed to synchronous elements within the chip over a global clock line (CLOCK 106) which extends across the chip. External point XP3 supplies a clock suppress signal over a $\overline{HALT}$ line to one input terminal of AND gate 110. Another input terminal of AND gate 110 receives the global clock signal. The output terminal of AND gate 110 drives a function clock distribution line (F-CLK 107) which connects to the clock input terminals of all scan latches ($SL_{zyx}$).

When IC chip 100 is in a normal operating mode, a logic "1" is placed on the $\overline{HALT}$ line. When the $\overline{HALT}$ line is placed in a logic "0" state the chip 100 enters a test mode. Clock pulses are suppressed from passing through AND gate 110 onto the SL CLK line 107, thus freezing all the scan latches ($SL_{zyx}$) in their current states and blocking them from responding to new data on their respective D input terminals.

The output state of scan latch $SL_{111}$ is detected at scan point SP by a first input terminal of a point-sensing AND gate 120. A second input terminal of this AND gate 120 receives a column select signal X1 from an address decoding circuit 150. A third input terminal of the point-sensing AND gate 120 receives a row select signal Y1 from the address decoding circuit 150.

Decoding circuit 150 addresses the scan point, $SP_{111}$, by driving column line X1 and row line Y1 both to the logic "1" level while leaving all other column and row lines at logic "0". The state of the addressed scan point $SP_{111}$ then passes through the point-sensing AND gate 120 and it is output from the AND gate output terminal as a corresponding point scan-out signal $SO_{111}$. This point scan-out signal $SO_{111}$ now represents the detected state of the scan point having a column coordinate of X=1, a row coordinate of Y=1, and a plane coordinate of Z=1.

Scan-out signal, $SO_{111}$, and all other similar point scan-out signals ($SO_{112}$, $SO_{113}$, etc. of a first conceptual plane Z=1 are collected by a plane-sensing OR gate 122 whose output signal, $SOZ_1$, is supplied to a first input terminal of a plane-selecting multiplexer 124. Other plane-sensing OR gates (not shown) present their respective plane scan-out signals ($SOZ_2$, $SOZ_3$, etc.) to other input terminals of multiplexer 124. A Z address signal of appropriate bit-width is applied to multiplexer 124 to select a desired one of the plane scan-out signals ($SOZ_1$, $SOZ_2$, $SOZ_3$, etc.). The multiplexer 124 outputs the selected signal onto a global SCAN OUT line which then relays the signal to an external connection point, XP8.

A scan address register 160 stores scan address information (SADR) for identifying each conceptual column (X), each conceptual row (Y), and each conceptual plane (Z) of the system under test 100. A Z component of the address information is coupled to multiplexer 124, as mentioned above. The address information stored in register 160 is further coupled to the address decoding circuit 150 which, in response, activates a selected one of column lines X1, X2, . . . , Xn, a selected one of row lines Y1, Y2, . . . , Ym, and a selected one of plane addressing lines Z1, Z2, . . . , Zl (where 1, m, and n represent integers sufficiently large to identify all scan points $SP_{zyx}$ in the chip 100).

When the normal operating circuits ($CKT_{111}$, $CKT_{112}$, etc.) of the chip 100 are relatively few and simple, the chip may have enough spare external connection points for loading the scan address information (SADR), which is typically 9 to 11 bits long, in parallel into address register 160 (or directly into address decoder 150) through these spare connection points. On the other hand, if the chip 100 is relatively complex and uses most of its external connection points (pins) for transmitting normal mode signals, the scan address information (SADR) is preferably shifted serially into the address register 160 through a single address-receiving pin XP6. The contents of the scan address register 160 are presented to the address decoder 150 when a strobe pulse (STB) is supplied to a strobe receiving terminal of register 160 from an external connection point, XP7. A strobe pulse (STB) is supplied in synchronism with each pulse of an externally generated scan clock signal.

Needless to say, the shifting of the scan address (SADR) serially into register 160 takes more time than loading it directly into register 160 (or directly into decoder 150) by the parallel method. A tradeoff has to be made between how many pins are used to load the address register 160, how many pins are required for supporting normal mode circuit operations and how quickly the address register 160 (or decoder 150) needs to be loaded. Regardless of the method chosen for loading address register 160 (and/or decoder 150); a finite amount of time, $t_{ADR}$, is required for transmitting the scan address (SADR) to register 160 (or to decoder 150), for letting the column, row and plane signals propagate through the decoder 150 and through the multiplexer 124, and for allowing the row (Y) and column (X) lines to settle. This finite time $t_{ADR}$ limits the speed at which all the scan points $SP_{zyx}$ of the chip can be individually read and the speed at which the states of the scan latches $SL_{zyx}$ can be individually (serially) set.

Each scan latch $SL_{zyx}$ of FIG. 1A is set by way of the same addressing circuitry used to sense the states of the scan points. Referring to scan latch $SL_{111}$, its SET input terminal is driven by a latch-setting AND gate 121. Two input terminals of this AND gate 121 are respectively driven by the same row and column flines (Y1 and X1) which drive the point-sensing AND gate 120. A third input terminal of the latch-setting AND gate 21 receives a plane-write signal WZ1 from a plane-setting AND gate 123. Plane-setting AND gate 123 has one input terminal coupled to a Z1 plane-designating line. The plane-designating line Z1 is driven by decoding circuit 150. Another input terminal of AND gate 123 is connected to a SCAN IN line which may be used to transmit a latch-setting signal from external connection point XP5 to AND gate 123 and all other plane-setting AND gates (not shown) of the chip. The other gates function similarly to AND gate 123, but they are respectively driven by the other plane-designating lines Z2, Z3, etc.

The WZ1 write signal generated by plane-setting AND gate 123 is distributed to other latch-setting AND gates belonging to the first plane (Z1) so that each scan latch may be individually addressed and forced into a logic "1" state when desired.

By way of example, scan latch $SL_{112}$ is shown to have its SET terminal driven by latch-setting AND gate 131. Gate 131 has first and second input terminals respectively driven by the column X2 line and row Y line. A third input terminal of latch-setting AND gate 131 receives the WZ1 signal. Scan-point detecting AND gate 130 operates similarly to gate 120 except that it is addressed by column X2, row Y1 and it detects the state of scan point $SP_{112}$.

From FIG. 1A, it can be understood that if a serial loading scheme is used to set each scan latch after a global reset, the time required for loading a desired test vector into all the scan latches $SL_{zyx}$ increases in proportion to the number of scan latches which have to be set after the global reset operation. A problem develops when the number of scan latches becomes so large that it takes an unacceptably long time to load a test vector.

Figure 1B:
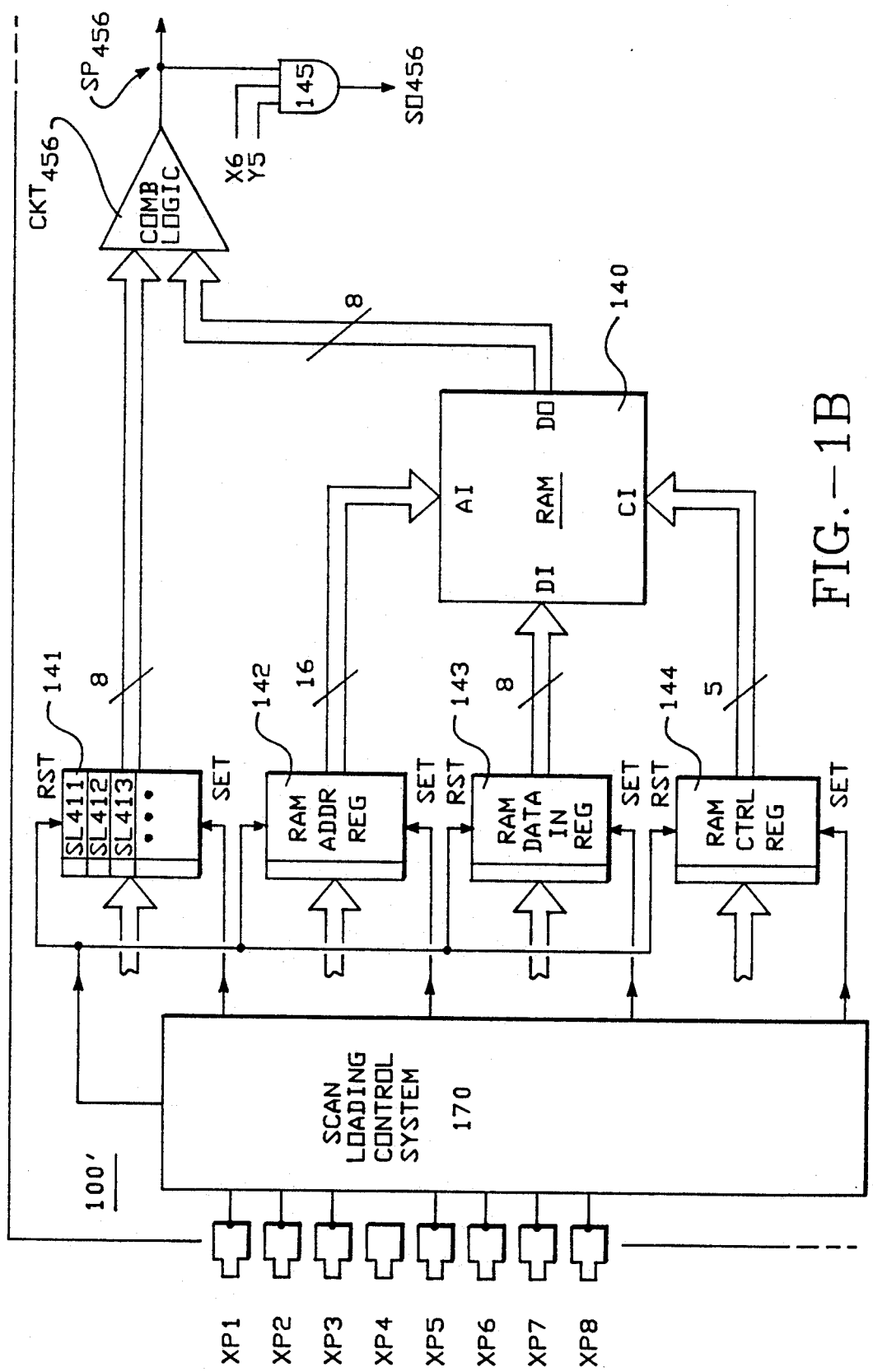
FIG. 1B is a schematic diagram of a second, more complex integrated circuit chip to be tested which includes an on-chip scan testing system.

Referring to FIG. 1B, the problem worsens when the system under test (100′) includes a combination of a high-density memory array (RAM) 140 and combinatorial gate logic $CKT_{456}$ on the same chip and when, for test reasons, the combination has to be loaded with thousands or millions of different test vectors in very short time. The second SUT 100′ (which is an IC chip similar to that of FIG. 1A) comprises a plurality of scannable registers, 141, 142, 143, 144, etc. Each scannable register is formed of a series of scan latches and each such scan latch is coupled to scan test control circuit 170 such that the scan latches of FIG. 1B can be individually set or globally reset in the manner described for FIG. 1A. Only a few scan latches, $SL_{411}$, $SL_{412}$, $SL_{413}$, ... are shown within the first scannable register 141 of FIG. 1B for the sake of illustrative brevity.

The Q output terminals of the plural latches within the first scannable register 141 drive a plurality of corresponding input terminals belonging to subcircuit $CKT_{456}$. This subcircuit $CKT_{456}$ is formed of a combinatorial network of logic gates which drive scan point $SP_{456}$. A second scannable register 142 (also having plural scan latches which are not shown) serves as a RAM address register for driving an address input port (AI) of RAM 140. Similarly, a third scannable register 143 serves as a RAM data input register for driving a data input port (DI) of RAM 140. And a fourth scannable register 144 serves as a control register for driving a control signals input port (CI) of RAM 140.

RAM 140 has a data output port (DO) which drives additional input terminals of the combinatorial logic network $CKT_{456}$. A scan-point sensing AND gate 145 which is addressed by the scan control 70 through the X6 and Y5 address lines, returns a scan output signal $SO_{456}$ to the scan control circuit 170.

The RAM address register 142 and RAM data input register 143 can each have 8, 16 or more scan latches, depending on the size of RAM 140. All of these scan latches have to be reloaded with a new test vector every time a new data word has to be loaded into an arbitrary location within RAM 140. The number of times that a new test-vector has to be loaded into chip 100′ can easily climb into the millions during a normal testing procedure, and accordingly, the time required for fully testing the circuitry of chip 100′ can become unacceptably long.

Returning to FIG. 1A, the set of all scan latches $SL_{111}$, $SL_{112}$, ..., $SL_{xyz}$ within the SUT 100 is divided into a plurality of unique groups where each group preferably comprises two or more scan latches. A minority of the groups may constitute one scan latch each when more than two groups are defined. A latch group addressing unit 180 is further provided in accordance with the invention for detecting certain addresses within address register 160 and issuing group switch command signals 181, 182, etc., to corresponding ones of the predefined groups of latches when the certain addresses are detected. The address space of address register 160 is made sufficiently large to address all the scan latches and scan points of IC chip 100 while reserving certain additional addresses for activating the group command lines of the group addressing unit. Each group switch command signal 181, 182, etc., couples simultaneously to the scan latches of its corresponding group and forces the latches of the group into a predefined state such as the reset (logic "0") state. In the illustrated example, OR gates 191 and 192 are shown driving the respective RST terminals of scan latches $SL_{111}$ and $SL_{112}$ to thereby reset those latches in response to reset signals delivered either over the global scan reset line 105 or group command lines 181 and 182.

The states of small groups of scan latches can be quickly modified through the use of the latch group addressing unit 180. The number of groups is preferably kept small, for example to approximately percent or less (64/600=10.6%) of the number of scan latches (typically 600) provided on IC chip 100 so that the size of the group addressing unit 180 is kept relatively small and the scan subsystem (160, 150, 180, 181, 182, etc.) does not consume more than approximately 30 percent of the substrate area available on IC chip 100. The advantages of such an arrangement will be more apparent after a test intensive environment is described immediately below.

Figure 2:
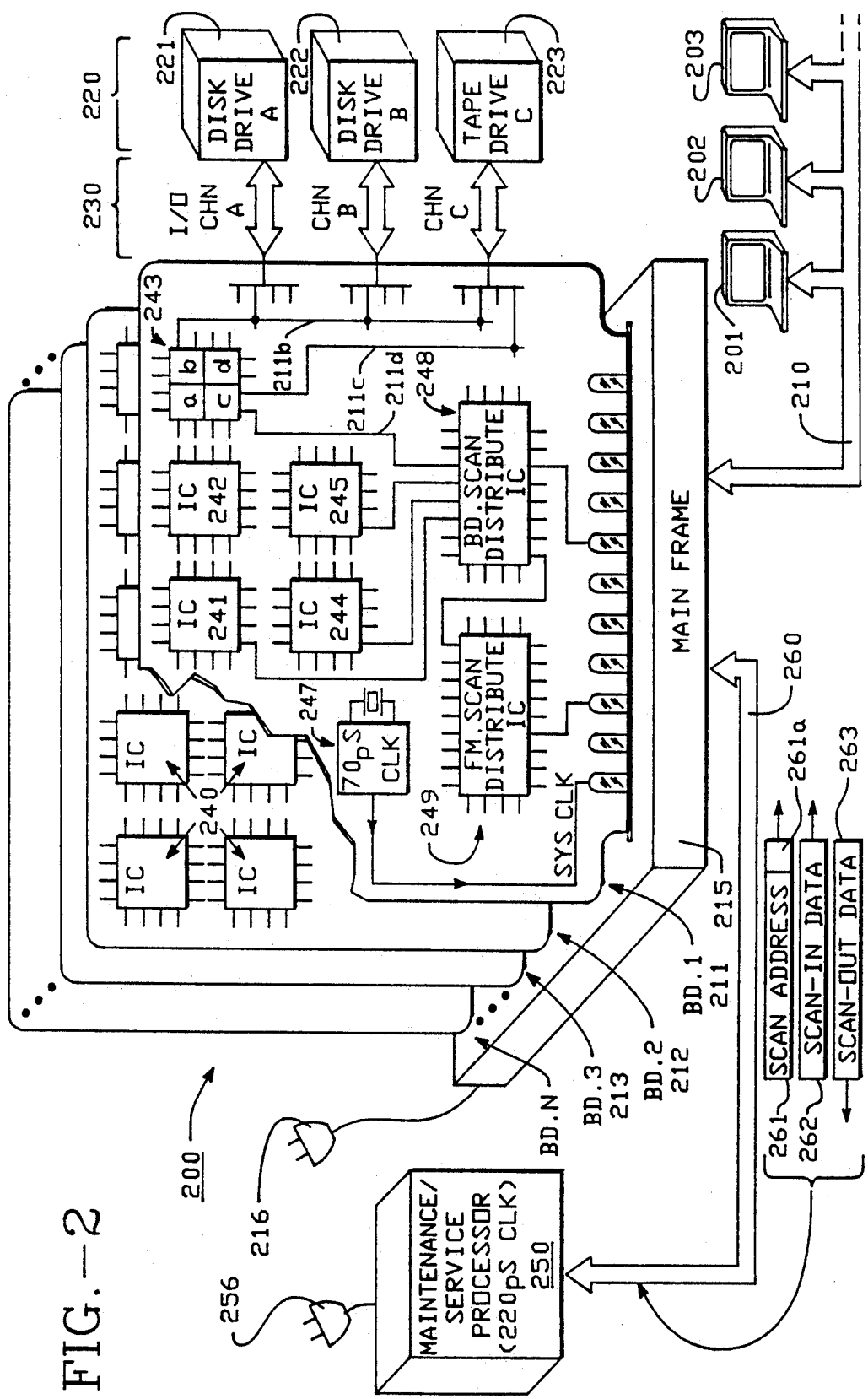
FIG. 2 is a block diagram of a service processor coupled to a scannable mainframe computer system in accordance with the invention.

FIG. 2 illustrates a test intensive environment in which many logic chips or logic/RAM combination chips may have to be tested in short time. Apparatus 200 is a mainframe computer which services multiple users, 201, 202, 203, etc. whose terminals are coupled to the mainframe computer by way of communications network 210. The mainframe computer 200 connects to a plurality of data storage and/or data processing peripherals 220 by way of a corresponding plurality of input-/output channels 230. In the illustrated example, the peripherals 220 include first and second disk drive units, 221 and 222 (also denoted as drive A and drive B), as well as a tape drive unit 223 (also denoted as drive C). Respective I/O channels, A, B and C, couple drives A, B and C to the mainframe computer 200. While not illustrated, it is to be understood that the mainframe computer 200 comprises a plurality of functional units including one or more arithmetic logic units (ALU's), memory management units (MMU's) and so forth which may be programmably interconnected to function together or independently of one another.

Mainframe users 201, 202, 203, etc., expect all the functional units of the mainframe computer 200, the peripherals 220 and the I/O channels 230 to be continuously available for handling their data processing needs in a reliable, error-free manner. To meet this expectation, a maintenance/service processor 250 is provided for continuously testing various parts of the mainframe computer 200, for diagnosing problems and for reconfiguring subsystems of the mainframe 200 or correcting erroneous states so that faulty operations are immediately uncovered and eradicated. The service processor (hereafter also SVP) 250 includes a power supply 256 which is independent of a corresponding power supply 216 servicing the mainframe computer 200. A scan-testing bus 260 couples the service processor (SVP) 250 to scannable circuitry within the mainframe 200. Scan bus 260 carries scan-address signals 261, scan-input data signals 262 and scan-output signals 263 between the SVP 250 and a large plurality of scannable, high-speed integrated circuit chips 240 (including 241-249) provided within the mainframe computer 200. The scan bus 260 allows the SVP 250 to access internal circuitry within each mainframe chip 240 so that the operability of internal subcircuits within each of these IC chips 240 may be tested and verified or corrected by the independent SVP 250.

The IC chips 240 (including 241-249) are each implemented with emitter coupled logic (ECL) to operate at switching speeds in the range of 70 picoseconds (pS) to 80 pS. Each chip 240, 241-249, is fabricated with very large scale integration (VLSI) technology to provide as many as 15,000 or more logic gates within a 17 millimeter-square ceramic package having as many as 316 external connection terminals (pins). Some of the chips 240 consist entirely of random logic gate circuitry. Others of the chips 240 each contain up to 32 kilobits (Kb) of on-chip static random-access-memory (SRAM) in combination with up to 8,000 on-chip logic gates. Still others of the chips 240 can contain up to 64 Kb of SRAM in combination with 3.5 K of logic gates (K=1024).

Approximately 30% of the substrate area in each IC chip 240 is dedicated to providing scan-testing functions while the remaining 70% is devoted to supporting normal-mode circuit operations. The normal-mode circuits are typically clocked by periodic clock signals having a period in the range, 7 nanosecond (nS) to 14 nS and switching times in the range, 70-80 picoseconds (pS). Portions of the scan-testing circuitry not in direct series with the normal operating mode circuits are typically clocked by slower scan-address clock having a 50 nS period.

A plurality of glass ceramic printed circuit boards (with up to 52 layers each) support the mainframe IC 240 and connect one to the next. The boards 211, 212, 213, etc., (also labelled as BD.1, BD.2, ..., BD.N) plug into a mainframe rack 215 which supports the boards and couples one to the next. There are typically six to sixteen printed circuit boards in the mainframe computer 200 with each printed circuit board (211) supporting as many as 144 high-speed IC chips 240. Each board (211) has approximately 4,000 to 7,200 signal-carrying contacts connecting it to the mainframe rack 215. Approximately 50 of these signal-carrying contacts carry the signals of the scan test bus 260. It will be seen below that this small percentage of contacts (50/7200=0.007%), in conjunction with the addressable group-resets of the invention, provides a sufficient roadway by which the service processor (SVP) 250 can transmit group addressing signals and, through these signals, exert direct control over a wide variety of special-purpose circuits within the mainframe 200 (i.e., CIS message transmission, clock suppression within a select portion of each IC, scan-generated write-strobe, etc.).

The service processor (SVP) 250 is housed separately from the mainframe computer 200, is separately powered (256), and is fabricated with VLSI ECL gate array technology packaging approximately 4,480 logic gates on each of a plurality of 128 pin IC chips (not shown) which operate at switching speeds of approximately 220 pS. This slower but more mature technology is employed to assure the reliability of the SVP 250. All IC chips of the SVP 250 include scan circuitry having initialization groups in accordance with the invention so that the SVP 250 (or an external boot-strap circuit) can quickly load test vectors into its own IC chips and thus quickly verify the operability of its own circuits before proceeding to verify the operability of subcircuits within the mainframe 200.

The scan address signals 261 output from the SVP 250 identify each subcircuit of the mainframe 200 according to which board it is mounted on, which IC chip 240 it is packaged within and according to where within the identified chip the subcircuit is located. The mainframe 200 includes one or more frame-scan distribution chips 249 for distributing scan address and scan-input data signals (261 and 262) to the individual boards (211, 212, etc.) and for collecting scan-output data signals 263 from the individual boards. Each board (i.e., 211) includes a board-scan distribution chip 248 for similarly distributing scan address and scan input data signals to each of the IC chips 240 on the board and collecting scan-out data signals from the chips of that board.

Each IC chip 240 is defined to have approximately 600 scan points ($SP_{zyx}$) and approximately 600 scan latches ($SL_{zyx}$) within it. Each of the scan address signals 261 output from the service processor 250 includes a 10 to 11 bit long IC address field 261a for defining a scannable address space within each IC chip 240 having as many as 1,024 to 2,048 logical scan addresses. The structure of this address space will be explained later (see FIG. 4).

An example of a maintenance and service problem will help to explain the operations and advantages of a scan system in accordance with the present invention. Circuit board 211 is shown supporting a plurality of IC chips, 241, 242, 243, 244, 245, etc., included among the chips 240 of the mainframe 200. This plurality of chips 241-249 includes a board scan distribution chip 248 for distributing scan signals across the board 211, a frame scan distribution circuit 249 for distributing scan signals across the frame rack 215 and a clock generating circuit 247 for generating and distributing system clock signals (7-14 nS clock periods) to all parts of the mainframe 200.

For the example, it is assumed that IC chip 243 is part of an I/O communications subsystem in the mainframe 200 and that this IC 243 can be conceptually partitioned into four functional compartments, 243a, 243b, 243c, and 243d. Compartment 243b is responsible for providing circuit functions critical to the operability of all I/O channels A, B and C. Compartment 243c is responsible for providing circuit functions critical only to the operability of I/O channel C. Compartments 243a and 243d support unrelated functions. I/O channels A and B can continue to operate even if the circuits in compartments 243a, 243c or 243d fail.

The tight coupling between compartment 243b and all of I/O channels A, B and C is indicated by the interconnections of board bus 211b to these I/O channels. The tight coupling between IC compartment 243c and only I/O channel C is indicated by board bus trace 211c. The coupling between all the circuitry within IC 243 and the board scan distribution circuit 248 is indicated by board bus trace 211d.

For this example, it is further assumed that, because of overall system requirements, normal circuit operations within IC chip 243 can not be suspended for any continuous period of more than 800 milliseconds (mS). If the 800 mS limit is obeyed, then sub-second suspensions of operations within IC 243 will be transparent to the end users 201, 202, 203, etc. and scan test procedures can be carried out in the background without disrupting normal operations. On the other hand, if normal circuit operations within IC 243 are halted for a continuous period longer than 800 mS, each of the peripheral devices 220 will independently disconnect itself from its respective I/O channel 230 and the end users 201, 202, 203, etc. will lose access to data stored in one or more of these peripheral devices 220. Such disconnection is undesirable.

When the SVP 250 scans a subcircuit, the normal mode clocks to the subcircuit have to be halted. This allows test vectors to be loaded into scan latches as earlier described. The maintenance/service processor 250 should try to limit the time consumed by all its test procedures so that no one procedure halts any of the I/O subcircuits in the mainframe ICs 240 for a continuous period greater than 800 mS. This way, undesirable disconnects will be avoided.

Sometimes it is not possible to complete a test procedure within the 800 mS time limit. In such cases, it is preferable to confine the disruptions created by such over-long test procedures to only those subcircuits which have to be tested. Other subcircuits which do not need to participate in the test should be able to continue their operations undisturbed. It will be seen below how the invention reduces the time for test procedures and if the tests are too long nonetheless, how the invention helps to confine disruptions to only the subcircuits which must participate in the test.

Suppose that IC 243 operates properly when it is first fabricated and mounted onto circuit board 211. However, due to a complex set of interactions between the design of chip 243, its location on the printed circuit board 211 and thermally-generated stresses which develop only after a long period of time, intermittent errors begin to creep into the data transmissions across I/O channel C and the number of transmission retries increases by a small but significant amount. System operators do not yet know that this is the problem. They do not even know whether the cause of the problem lies in the mainframe 200 or in the peripheral tape drive 223.

To further complicate the situation, let it be assumed that IC 243 includes two logic/SRAM combination circuits of the type illustrated in FIG. 1B; one is in compartment 243b and the other is in compartment 243c. It would take more than 800 mS to simultaneously load all necessary test vector bits into the scan latches of all compartments 243a, 243b, 243c, and 243d if a global reset were used before the loading of each individual test vector. If the scan latches of compartment 243b and 243c could be loaded independently, however, then there would be enough time.

The design of IC 243 could be changed to include two separate scan test circuits, one for compartment 243b and one for 243c. But separate scan systems for each of compartments 243a-243d would consume an excessive amount of the substrate area available on IC chip 243. A better solution would find a way to load the necessary test vector bits within the 800 mS time limit while constraining the scan-testing circuitry of IC chip 243 to approximately 30% or less of the real estate available on the substrate of chip 243.

Figure 3:
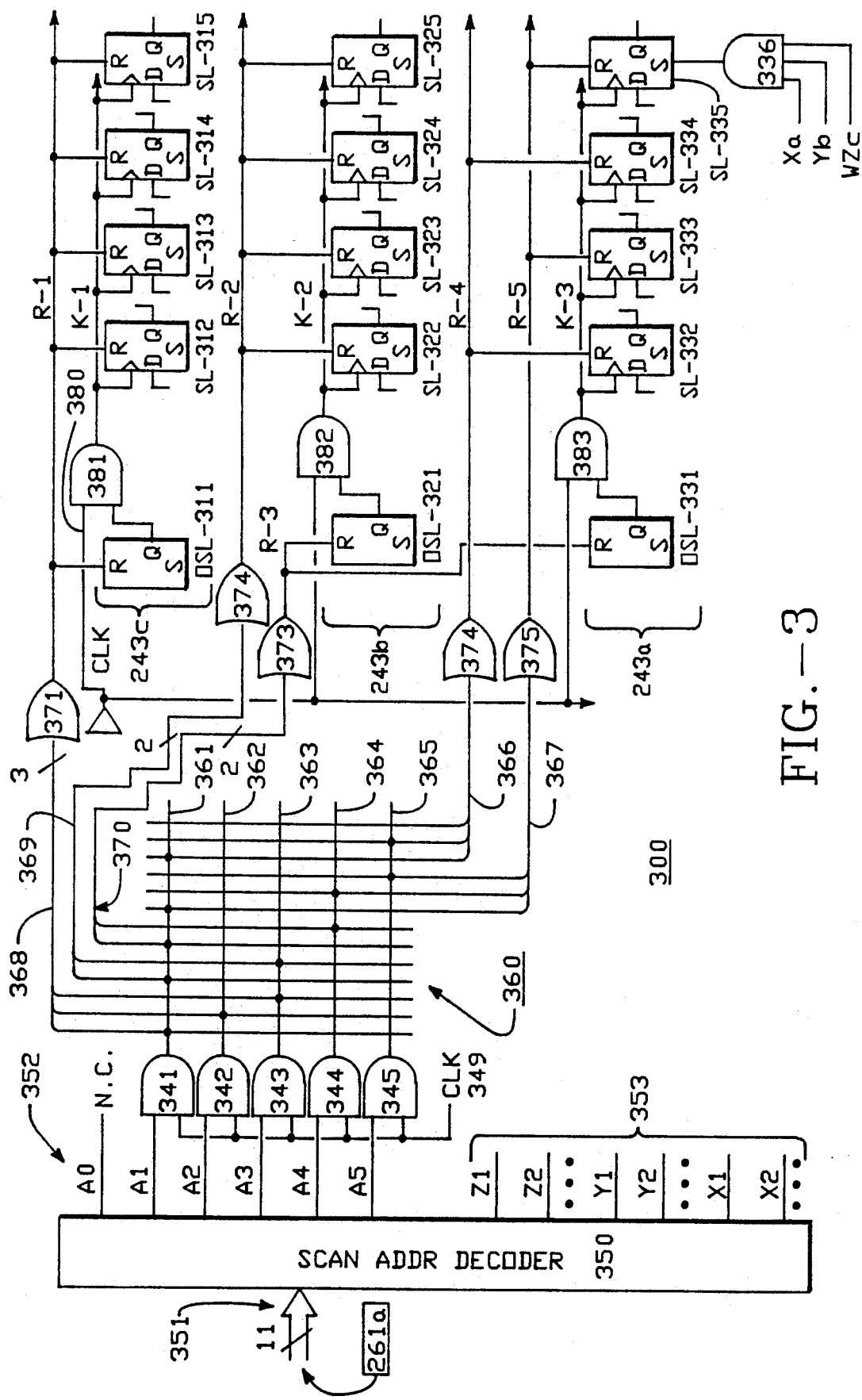
FIG. 3 is a schematic diagram of a subsets addressing and initializing circuit in accordance with the invention.

Referring to FIG. 3, an on-chip scan-testing subsystem 300 in accordance with the invention is illustrated. This scan-testing subsystem 300 (or an equivalent thereof) is incorporated into each IC chip 240 (including 241-249) of the mainframe 200.

A scan address decoder 350 of subsystem 300 receives a 10 or 11 bit long scan address field 261a at its input port 351 from a corresponding 10 or 11 bit long scan address register (not shown, but similar to 160 of FIG. 1A), which register is driven by the service processor 250. The 10 or 11 bits of field 261a are used to define an on-chip scan address space having 1,024 or 2,048 addressable points.

The scan address decoder 350 has a first output port 352 including a number of individual address-designating lines, A0, A1, A2, etc. In addition, the scan address decoder 350 has a second output port 353 comprising column lines X1, X2, etc., row lines Y1, Y2, etc., and plane designating lines Z1, Z2, etc. as previously mentioned for addressing individual scan points and scan latches within the chip.

Figure 4:
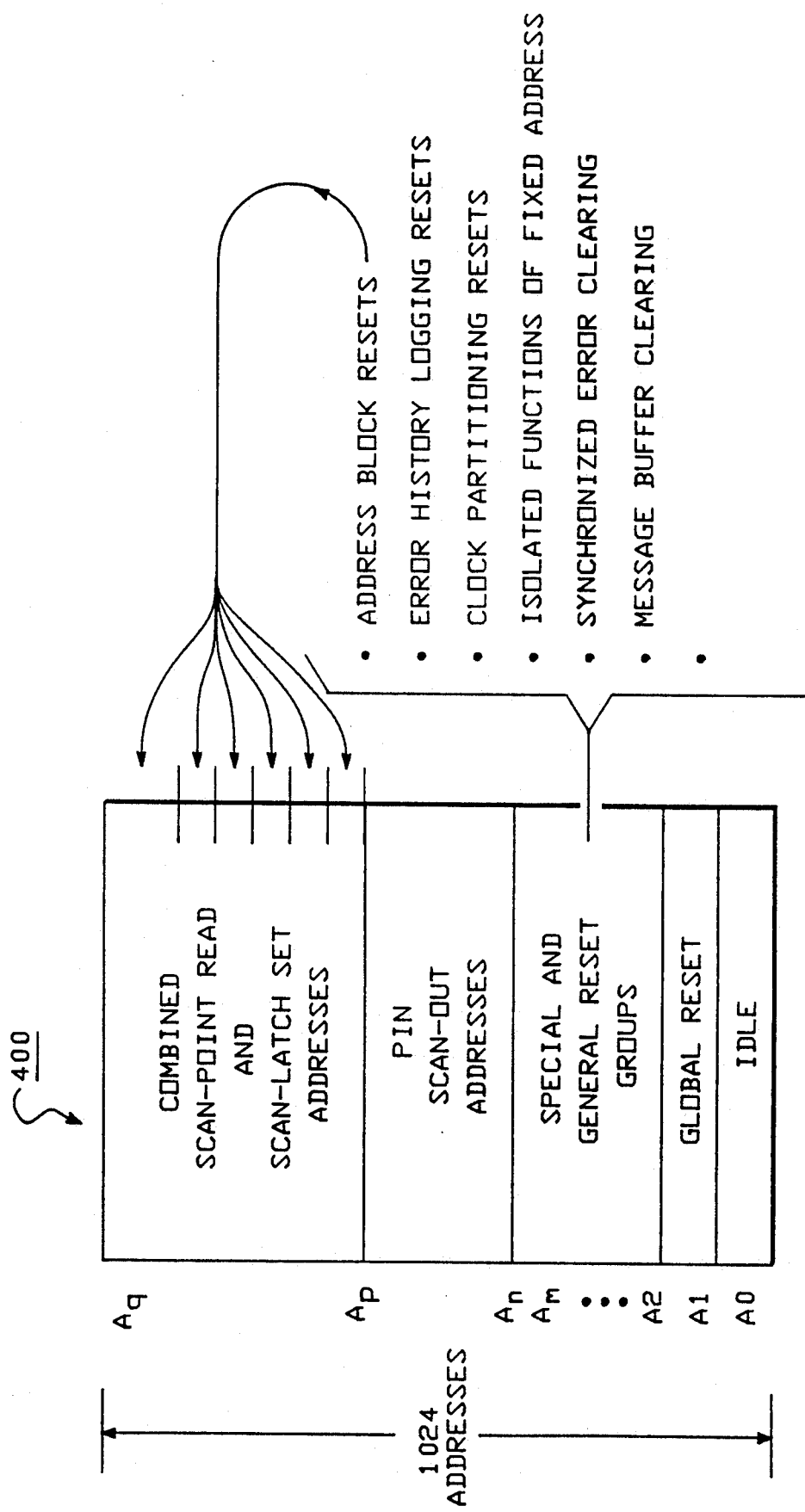
FIG. 4 illustrates an address space partitioning scheme in accordance with the invention.

A corresponding one of the address designating lines, A0, A1, etc., is activated, on a mutually exclusive basis, when the address field 261a presented at input port 351 holds a low-ordered address in the defined address space (see FIG. 4). When higher-ordered addresses are designated by the received address field 261a, none of the address-designating lines A0, A1, etc., are activated, and instead, one of the XYZ triplets of output port 353 is activated for addressing an individual scan point and/or scan latch.

Address designating line A0 preferably has no connection (N.C.) so that nothing happens when it is activated. The scan circuitry of the chip is in "an idle" mode and normal mode operations of the chip can proceed as if the scan testing system 300 were not present.

When one of the address designating lines other than A0 is activated, a predefined combination of test vector bits (usually all logic 0's) is automatically loaded into some or all of the scan latches of the test subsystem 300.

Address-designating lines A1, A2, A3, etc. each connects to a first input terminal of a respective one of pulse-synchronizing AND gates 341, 342, 343, etc., as shown. A second input terminal of each AND gate 341, 342, etc., receives square-shaped clock pulses 349 for synchronizing the first port outputs (A1, A2, etc.) of the scan-address decoder 350 with an externally-generated scan-address clock. A synchronized and correspondingly shaped square-pulse is output on a respective one of AND gate output lines 361, 362, etc.

The AND-gate output lines 361-365 are shown to cross with a set of OR-input buses 366-370 to thereby define a reset-group assigning grid 360. One or more interconnections are made on each AND-output line (361-365), as indicated by the dots in grid 360, for coupling that output line (361, 362, etc.) to one or more of the OR-input buses (366–370). As will be seen shortly, these interconnections assign each of plural scan latches within scan subsystem 300 to one or more "reset groups."

Each member of a plurality of reset OR gates, 371, 372, 373, 374, and 375, receives the input lines of a corresponding one of the OR-input buses 368, 369, 370, 366 and 367, as shown. The output terminal of first reset OR gate 371 connects to a first reset distributing line, R-1, which distributes a reset pulse generated by OR gate 371 to the reset receiving terminals (R) of scannable latches OSL-311, SL-312, SL313, SL314, SL-315, etc., as shown.

The first latch in this series, OSL-311, is a so-called "operating state latch." This type of scan latch is not driven by a system clock, and does not pass normal operating mode signals through it. It is generally used for statically "configuring" programmable circuits within the IC chip. In the illustrated example, latch OSL-311 configures a first clock-suppressing AND gate 381 to either pass or not pass a system clock signal (CLK) 380 onto a first clock distributing line K-1. Line K-1 distributes the output of AND gate 381 to the clock receiving terminals of remaining latches SL-312, SL-313, etc. in the series, OSL-311, SL-312, SL-313, etc.

It will be assumed that this series of scan latches, OSL-311, SL-312, SL-313, etc. belong within compartment 243c of the earlier mentioned IC chip 243. Each scan latch of compartment 243c has a set receiving terminal (S) for receiving a scan-set signal as mentioned earlier. Each of the clocked scan latches, SL-312, SL-313, etc., passes one of the normal operating signals of compartment 243c from the D input terminal of the latch to its Q output terminal while a normal operating mode of that compartment 243c is maintained. However, when the Q output terminal of OSL-311 applies a logic "0" to the clock-suppressing AND gate 381, the corresponding clocked scan-latches, SL-312, SL-313, etc., stop receiving clock pulses from the clock distributing line K-1 and compartment 243c then goes into a scan-test mode.

The reset-assigning grid 360 is wired in the example of FIG. 3 such that, when address-designating line A2 is activated, the corresponding output line 362 transmits a reset pulse only to bus 368. This reset pulse passes through OR gate 371 and simultaneously resets operating state latch, OSL-311, in compartment 243c. The Q output state of OSL-3 drops to logic "0" and causes AND gate 381 to block clock signals from passing to all the clocked scan latches, SL-312, SL-313, etc., in compartment 243c. Thus, compartment 243c automatically goes into a test mode while other compartments of the IC chip 240 remain unaffected.

If the R-1 reset-distributing line remains active long enough after OSL-311 resets or the A2 address line is asserted a second time after OSL-311 resets, all of the clocked latches, SL-312, SL-313, etc., in compartment 243c will be reset as well.

Referring momentarily back to FIG. 2, it is seen that I/O channels A and B can continue operating at full speed even though normal mode operations are suspended in compartment 243c. Once system clock pulses are blocked in compartment 243c and the clocked scan latches are all reset, the SVp 250 can quickly load test vector bits into the reset latches, SL-312, SL-313, etc., of compartment 243c and, through these test vector bits, exercise various interactions between chip 243 and I/O channel C without disturbing I/O channels A and B. And since only the scan latches of compartment 243c are reset by activating A0, no time has to be wasted saving a copy of the states of all other scan latches of IC chip 243 in an external RAM and reloading all the states back into chip 243. Compartment 243c can be independently reset and reloaded with desired test bits repeatedly, at a rate much higher than previously possible when all the latches of a chip were reset by a global reset pulse.

As further shown in FIG. 3, compartment 243b contains an operating state latch OSL-321 and plural scan latches SL-322, SL-323, SL-324, SL-325, etc. The reset receiving terminals (R) of scan latches SL-322, SL-323, etc., all connect to a second reset distributing line R-2, which is driven by OR gate 372. The clock receiving terminals of these scan latches are driven by a second clock distributing line K-2 which receives clock signals passed through a second clock-suppressing AND gate 382. Unlike the arrangement in compartment 243c, the operating state latch OSL-321 of compartment 243b receives reset pulses from a third reset distributing line R-3 which is driven by OR gate 373. When address-designating line A4 is activated, a reset pulse is transmitted from corresponding output line 364 through bus 370 and OR gate 373 to reset the operating state latch OSL-321 but not to reset the other scannable latches of compartment 243b. Clock distributing line K-2 is suppressed with the activation of address-designating line A4 and the current states of scan latches SL-322, SL-323, etc., are thus frozen to create a snapshot picture of the 243b compartment at the time A4 was activated.

If address-designating line A3 is thereafter activated, then a reset pulse will be transmitted from corresponding output line 363, through bus 369 and OR gate 372 to thereby simultaneously reset all of scan latches SL-322, SL-323, etc. A desired test vector can then be quickly loaded into these latches using the scan-latch setting operation described earlier.

A further variation is shown in FIG. 3 for the scannable latches of compartment 243a. Scan latches SL-332 and SL-334 receive reset pulses from a fourth reset distributing line R-4 driven by OR gate 374. Scan latches SL-333 and SL-335 receive reset pulses from a fifth reset distributing line R-5 driven by OR gate 375. Operating state latch OSL-331 receives its reset pulse from the third reset distributing line R-3 which is driven by OR gate 373.

For the sake of illustrative convenience, one latch-setting AND gate 336 is shown driving the S terminal of scan latch SL-335. This is to indicate that all scannable latches of FIG. 3 may be individually set by supplying an appropriate column-designating signal Xa, row-designating signal Yb, and plane-writing signal WZc to their respective latch-setting AND gates (not shown).

It will be understood, of course, that FIG. 3 merely illustrates a few variations possible under the present invention. The reset OR gates 371, 372, etc. may be connected to reset any subset of OSL's or SL's in a scannable IC chip in response to activation of any one or more of address designating lines A1, A2, etc., as desired by a chip designer.

Some important features should be noted in the embodiment of FIG. 3. The one or more interconnections made along each AND output line (e.g., 361) to connect it to the inputs of one or more reset OR gates (e.g., 371) defines a "reset group" consisting of the latches driven by those reset OR gates. All the latches of an addressed reset group simultaneously respond to the scan address designated by its respective address-designating line (e.g., A1). Each reset group can contain just one scan latch or it may contain any other unique subset chosen from the set of all scannable latches on the IC chip, or it may consist of all the latches on the chip.

By way of example, the interconnections shown on output line 361 define an "addressable" global reset group which contains all the illustrated scan latches. When this output line 361 is activated (by loading the scan address which activates only line A1), all the illustrated scannable latches are reset simultaneously. If addressable reset line A1 is wired to provide a global reset, the hardwired global reset pin (XP1 of FIG. 1A) may be dispensed with. Alternatively, the hardwired reset pin (XP1) may be OR'd to the reset terminals of some rather than all scan latches of the IC chip (as shown in FIG. 1A) to provide a special-purpose "non-addressed" reset group which co-exists with the addressable reset groups. Latches belonging to the non-addressed reset group can be reset more quickly by that route rather than by activating a corresponding, addressed reset group because the time delay of decoder 350 (or unit 180, FIG. 1A) is bypassed.

Output line 362 is connected to define a reset group containing only those scannable latches whose reset terminals are driven by OR gate 371 (and reset distributing line R-1). The reset group defined by the interconnections of output line 363 contains all the latches driven by reset OR gate 371 plus all the latches driven by reset OR gate 372. The interconnections of output line 364 define a reset group containing all the latches driven by reset OR gate 373 and reset OR gate 375. Output line 365 has another set of interconnections which define yet another reset group containing all the latches driven by reset OR gates 374 and 375.

Grid 360 can, of course, be expanded to define more AND gate output lines (e.g., 361) or more OR gate input buses (e.g., 368) as desired. Expansion should not proceed without limit, however, since more lines consume more area on the chip. And besides, there is a point of diminishing returns where the usefulness of a particular group is outweighed by the extra space its support circuitry occupies. A preferred arrangement is to keep the number of reset groups in the range 8 to 64 for the case where the scan address-space has 1024 locations, thus consuming approximately 0.008% to 0.063% of the address space for the group reset functions. A more preferred range is 15 to 32 out of 1024 locations. Roughly half of these locations are used for general-purpose reset blocks (discussed below) and the remaining for special-purpose resets (also discussed below).

Some key differences between the scan testing subsystem 300 of FIG. 3 and the scan testing subsystem of an IC chip (not shown) which does not have addressable reset groups are as follows. The scan address field 261a received by decoder 350 may have to be made slightly larger (i.e., one bit longer) to encompass the individually addressable points A0, A1, A2, etc., in the scannable address space of the IC chip 240. Thus, the decoder 350 and the address register driving may have to be slightly larger in size. The scan testing subsystem 300 additionally includes the pulse synchronizing AND gates 341-345, the reset-group assigning grid 360, the reset-pulse collecting OR gates 371-375 and the reset distributing lines R-1 through R-5. The amount of chip substrate area consumed by this additional circuitry is relatively small in comparison to the surface area which would be consumed by a circuit that allows each one of all its scannable latches to be individually reset.

An advantageous balance is struck between the size, speed and flexibility of the scan subsystem 300. The circuit designer is given great flexibility in deciding how many reset groups there will be on the IC chip and which one or more of the reset groups each scannable latch will be assigned to. A small subset of all the latches on the IC chip may be reset while the rest of the latches remain unaffected and, if the desired test vector is other than all zeros for these reset latches, only these latches have to be addressed and set to develop the desired reset vector. Thus, there is a speed advantage over the previous scan-loading technique. A copy of the logic states of all other scannable latches within the IC does not have to be maintained in a separate, external RAM circuit since the remaining latches of the scanned IC chip are unaffected by a group reset pulse. This shortens test time even more. One part of a scanned IC chip (e.g., compartment 243c) can be frozen for test purposes while another part (e.g., compartment 243b) can continue to operate normally while scan testing proceeds. This option was not available before.

FIG. 4 illustrates one way in which the address space of scan address field 261a may be subdivided to define useful reset groups. It is assumed that there are approximately 600 scannable latches on the IC chip which can share scan addresses with some 600 scan points of the chip. There are approximately 300 other scan points which have their own private scan addresses. The scan address field 261a has 10 bits thereby defining an address space of 1,024 points of which 900 are devoted to addressing scan latches and scan points individually while a remaining 124 are available for defining as many as 124 group resets.

The lowest address, A0, is reserved for the scan idle function. The next higher address, A1, is reserved for the global reset function. The address space from A2 to Am is reserved for special and general purpose reset groups, to be explained shortly. Above this, the range An-(Ap-1) is reserved for addressing scan points which do not have corresponding scan latches. Typically, every external connection point (pins) of an IC chip has a corresponding scan point so the state of the external pin can be sensed through the scan testing network.

The uppermost addresses, Ap-Aq of address space 400 serve as dual-function addresses for both reading the state of an addressed scan point and optionally setting its corresponding scan-latch. This upper address span, Ap-Aq is conceptually subdivided into a plurality of address blocks, where each address block encompasses a sequential series of say, 64 or 128 or 256 addresses or another number of addresses that is conveniently addressable as a block, e.g., an integral power of two.

Each of the general purpose reset groups in address span A2 to Am corresponds to one of these address blocks. There does not have to be any special function or purpose which ties the latches of an address block logically one to the next. It might be that the only connection between some latches of a general purpose reset group is that their addresses reside in the same address block. The advantage of having general purpose reset groups is that any set of one or more scan latches within one of the address blocks can be quickly reset and loaded with new test bits using the corresponding general purpose reset group. Since the number of latches to be reloaded is relatively small in comparison to all the scan latches on the IC chip (the former number being, 64 or 128 or 256 or some other number which is easily blocked out by the decoder), the time for loading a test vector is substantially reduced in comparison to the previous method where all latches of address span Ap-Aq were globally reset and then each individually reloaded with the desired bit.

Typically, an external engine used for vector-loading will have a RAM buffer (not shown) which is sized to hold no more than say, 64 or 128 or 256 bits at a time, and a vector-loading counter (not shown) which is coupled to the RAM buffer for automatically sequencing through all the locations of this RAM buffer during a data unload cycle. It is advantageous to size the general purpose reset groups so they each contain a number of latches equal to the number of bits in the RAM buffer of the vector-loading engine; or conversely, to match the RAM buffer size to that of the general purpose reset groups so that vector-loading time can be minimized.

In addition to the general purpose reset groups, address span A2 to Am identifies a number of special-purpose reset groups whose latches are associated with specific operations of the IC chip. The resets for separately-clocked compartments of the IC chip (i.e., compartments 243c and 243b) exemplify one way in which latches are grouped according to functionality. In the case of the earlier-described compartment 243c, a reset to the clock suppressing OSL of this compartment acts to partition the IC chip into at least one portion where normal clock signals are suppressed and a second portion where normal clock signals continue to clock their corresponding scan latches. Thus, means are provided for conveniently partitioning each IC chip into separately scannable compartments which may be scanned while other compartments continue to operate in normal modes.

Another type of special purpose reset group automatically resets one or a group of on-chip counters and/or data registers. One such group of on-chip counters is used for error history logging. Referring back to FIG. 1B, let it be assumed that RAM address register 142 is also a counter that is periodically incremented by the system clock. Let it further be assumed that the RAM data input register 143 is stored by the same clock signal and collects the states of various points of interest within the IC chip. RAM control register 144 places RAM 140 in a data write mode. RAM 140 therefore begins to collect snapshots of the internal states of the IC chip in a wrap-around fashion over time. If an error condition is detected, the system clock is briefly suppressed from clocking the address register 142, and a frozen snapshot of the IC's internal states is thereby preserved in RAM 140 for analysis.

Once a faulty operation has been detected within the IC chip, it is advantageous to obtain a playback of the IC snapshots just as the fault was evolving. It is also advantageous to know when and where and error first developed and how it spread over time to other parts of the machine before it was recognized and halted. This is referred to as error history logging.

A special set of first-error latches and general error latches are included in the mainframe 200 of FIG. 2 for identifying the original location where an error arose and the areas of the mainframe to which progeny of the original error spread during the time it took to recognize the error and halt the system clock.

Referring to FIG.. 1B, after the SVP 250 (FIG. 2) recognizes that an error has occurred, it uses the scan address system to halt the clocking of RAM address register 142 and any other counters involved in error history logging. The SVP 250 then switches control register 144 by way of the scan system to put RAM 140 into a data read mode so its contents can be relayed out for external analysis. RAM address register 142 is reset by way of a group reset to initiate a playback sequence and a sequence of read addresses are then scan-loaded into address register 142 so that address register 142 addresses desired locations within RAM 140. Scan points (not shown) are provided across the data output port (DO) of RAM 140 for returning the snapshot data back to the service processor 250 (FIG. 2) over the scan bus 260.

The operations for resetting address register 142 and control register 144 to initiate a playback sequence can be quickened by defining RAM address register 142 and/or control register 144 as belonging to a reset group.

After an error history has been logged-out to the SVP 250, the first-error latches, the general error latches, control registers (e.g., register 140) and counters (e.g., address register 42 should be cleared to prepare them for the capture of a next error. The operations for resetting these latches, counters and so forth, to initiate a next error-history recording sequence can be quickened by defining these devices as belonging to another reset group (explained in more detail below). Such error-history record and playback reset groups are referred to in FIG. 4 as error history logging resets.

Still other special types of reset groups may be provided within a scannable IC chip as follows in the below examples (a)-(d):

(a) Test Initialization

The scan system is controlled by the SVP 250 to perform automatic tests such as net-verification, static function verification and dynamic function verification. OSL's which halt the application of system clock pulses to clocked scan latches are initialized by group resets to initiate these various tests. This quickens the speed at which such tests are performed.

(b) Isolated Functions of Fixed Address

The mainframe 200 (FIG. 2) has many IC chips 240 each of a unique design. When a latch-set location or group-reset location in a first IC chip 240 of a first design (not shown) is addressed, the resulting set or rest operation may produce different results from those when the same latch-set or group-reset location is addressed in a second IC chip 240 of a second design (not shown). To keep track of what function is associated with what address in each IC chip 240, the Automated Test Equipment (ATE) computer programs which are used for automated testing have to maintain separate maps (address/function maps), for each unique IC chip design, which cross reference individual latch-setting addresses with associated functions and group reset addresses with their related functions. In the case of some computer-driven test procedures, it is disadvantageous to spend time searching through a cross-reference map to find the address to be used for toggling a latch of special-function. To overcome this problem, one or more fixed addresses within the group resets address range A2-Am (FIG. 4) are specified as always belonging to a unique function irrespective of the IC design.

Addressing these fixed locations activates their unique functions if present within the IC design or does nothing if the unique function is not included in the IC design.

An example of such a unique function is a so-called "scan generated write-strobe" function. Some, but not all, of the IC chips 240 on the mainframe 200 (FIG. 2) contain a write-strobe latch which outputs a write-strobe pulse when the latch is reset. The write-strobe latch automatically toggles back to the set state (logic "1") after generating the pulse. The write-strobe pulse is used for strobing external or internal memory devices.

It is often desirable to generate many write strobe pulses with minimal delay between the pulses. Time would be wasted if, between each write-strobe pulse, an address had to be found and extracted from an address-/function cross-reference map belonging to an IC chip 240 under test. To overcome this problem a fixed address, say A10, is reserved in the address space A0-Am (FIG. 4) of all chips 240 for toggling the write-strobe latch of the IC chip (assuming the IC chip has such a latch) without disturbing any other latch of the IC chip. When this reserved address (A10) is asserted on the scan address bus 260, each receiving IC chip 240 will generate the write-strobe pulse if it contains a write-strobe latch or it will do nothing if does not contain a write-strobe latch. This is implemented for all IC chips 240 of the mainframe 200, irrespective of their individual designs. Thus, test software can be written to generate a rapid succession of write-strobe pulses without having to search for the address of the write-strobe latch of each IC chip in a collection of address/function cross-reference maps.

(c) Synchronized Error Clearing

The system clock pulses 380 (FIG. 3) of the mainframe 200 (FIG. 2) and scan clock pulses 349 (FIG. 3) of the SVP 250 (FIG. 2) operate at different clock rates and are generally asynchronous with one another. It is often desirable to initiate certain high-speed activities within the mainframe 200 in response to signals sent over the scan bus 260 from the slower-clocked SVP 250. It is further desirable to have these activities commence as soon as possible, without halting operations in the faster-clocked mainframe.

One of these activities is a so-called "error clearing" operation. When an error history is first logged out to the SVP 250 (explained above) it is not known precisely where the error arose and to what areas in the mainframe the error has spread or not spread. So when an error condition is indicated, the states of all error history latches, snapshot collecting RAM's, etc., within the mainframe 200, which could be directly or remotely related to the error, are scanned by the SVP 250 to determine what parts of the mainframe are infected by the error and what parts are not. To scan these parts, the SVP 250 first has to stop system clock pulses from reaching these parts. This means that operations in part or all of the mainframe 200 are disadvantageously stopped while the SVP performs a scan-out operation.

As soon as the SVP 250 completes its scan-out and determines that some parts of the mainframe 200 are not infected by the error, it releases those non-infected parts and allows them to continue their operations at full speed, that speed being established by the much faster system clock pulses. It is desirable, at the same time, to clear all error history latches of their previous states so they will be prepared to record and track a next-occurring error. But the error history latches are already receiving system clock pulses in the released parts of the mainframe. It would be disadvantageous to stop the mainframe system clock just to clear these latches.

To solve this problem, a special "error-clearing" OSL (not shown) is included in the IC chips 240 of the mainframe for automatically initiating the clearing operation without halting the system clock. A special group-reset address is reserved within address range A2-Am (FIG. 4) to allow the SVP to quickly reset this error-clearing OSL without directly altering the state of any other scan latch.

The Q output of the error-clearing OSL (not shown) connects to the D input terminal of a first in a series of flip flops clocked by the mainframe system clock (380). The series of flip flops (not shown) synchronize the logic "0" of the error-clearing OSL to the mainframe clock and supply the synchronized "0" to the D input terminals of all the error history latches through AND gates (not shown) thus clearing those latches while those latches are still receiving system clock pulses. The error-clearing OSL is returned to a logic "1" state soon after. In this way, old error history data is quickly erased while mainframe operations proceed without further pause.

(d) Message Buffer Clearing

In previous designs, a large number of dedicated wires connected a so-called "Console Immediate Control" (CIS) portion of the operator's console to the mainframe to allow for synchronized message exchanges between a constantly running mainframe and a slower service processor.

The mainframe 200 (FIG. 2) includes arrays of scannable message latches (not shown) which can be set and reset by the SVP 250 through the scan bus 260. The pattern of "1's" and "0's" in these message latches are periodically reviewed by the mainframe and interpreted as messages being sent from the SVP 250 to the mainframe 200. The slower running SVP can send messages asynchronously to the faster running mainframe through this mechanism while the mainframe continues to run at full speed.

To quicken the speed at which such messages are sent, a special reset group is reserved for clearing the message latches. The SVP 250 uses the message-latch reset group to load message bits into the mainframe message latches without disturbing other latches within the mainframe.

A variety of other useful applications for the special-purpose reset groups will become apparent to those skilled in the art in view of the above examples.

While the above examples show how the scan testing subsystem of the invention may be used within a complete computer system, it is to be understood that the utility of the invention is not limited to such an environment alone. The invention is useful in scanning complete systems which are up and running, but it may also be advantageously used to scan parts of the system as they are first being designed, developed, and cooperatively coupled one to the next.

The need for high-speed scan testing begins with the first steps in the design, development and manufacture of a high-performance computer. A hierarchical sequence of steps is followed, making the time consumed by first-level testing procedures just as critical as those in the completed computer.

The design of a computer (or other complex electronic system) usually starts at a relatively high level of abstraction where there are no logic gates or IC chips or boards or other implementation features. But the design has to be ultimately reduced to specific collections of logic gates or transistors on one or more IC chips; to specific IC chips on one or more circuit boards; to specific boards on one or more frames, and so on. Once such implementation details are defined, methods should be simultaneously devised for verifying the design, operability and reliability of the system components on a mass production basis as they progress from chip level to board level, to frame level and so on.

Since very large numbers of transistors (e.g., a hundred thousand per chip) or logic gates (e.g., 10,000 to 15,000 per chip) are usually defined in each of a large plurality of integrated circuit (IC) chips when complex circuits are assembled, methods should be devised for quickly verifying the proper functioning of all subcircuits of each IC chip at the transistor and/or logic gate level. Defining reset groups which isolate one subcircuit from the next helps to speed development and production.

Chips which fail on-wafer testing are marked for removal from the production run and these are redesigned or discarded. Those chips which successfully pass on-wafer testing are excised from the wafer and packaged such that the only access to internal points within the IC is through external pins of the IC package. The ability to quickly perform scan testing of internal components within the package becomes important at this level so that defective packaging procedures can be rapidly isolated and weeded out from the production line. Reset groups which help to isolate packaging problems help speed the process at this stage.

After IC packaging, large numbers of packaged chips are mounted to one or more printed circuit boards by soldering or other such means. If reset groups are defined for each board as a whole to isolate and correct board-level problems, then board level testing can be advantageously quickened.

After testing of individual boards, the boards are plugged into a machine frame and finally power is applied to activate all components of the computer in unison (system "bring up"). If special reset groups are defined for the system as a whole then system level testing can be quickened.

At each step of the hierarchical manufacturing process it is desirable to test and weed out defective components and/or to eliminate bugs in circuit or software designs as quickly as possible so that the reliability of the end product is enhanced. Wafers are probed to weed out bad IC chips or bugs in the design of each chip. Packaged chips are mounted on test fixtures and further tested to weed out those damaged by packaging. Completed circuit boards are tested after the chip mounting step. And so on.

Scan test circuitry in accordance with the invention is preferably built into every subcomponent of the computer system to enable rapid testing throughout the life of a computer system from the point of initial development through bring-up and beyond. Scan test circuitry with plural reset functions is provided on every IC chip to enable rapid testing and debugging at the wafer level, at the packaged chip level, board level, and higher levels. The corresponding test fixture at each level of testing is appropriately programmed to take advantage of the general purpose and special purpose reset groups.

The maintenance and service processor (SVP) 250 of FIG. 2, for example, is programmed to advantageously use the error history logging resets during error history logging procedures and to use the clock partitioning resets when partitionable portions of the system under test are being debugged or tested.

While a number of embodiments and uses in accordance with the invention have been illustrated, it is to be understood that numerous variations and modifications will become apparent to those skilled in the art after studying the above disclosure. By way of example, the scan latches of an addressed group do not have to be all reset to the logic "0" state when the group is addressed; some or all of the latches in the addressed group may instead be initialized the logic "1" state. It is left to the choice of the circuit designer to determine what initial state is best for each group of scan latches so that minimal time is needed for loading a test vector subsequence into the latches of the addressed group. The following claims are accordingly not limited to the specific descriptions found above, but rather encompass all embodiments and methods within the spirit of the above disclosure.

What is claimed is:

1. A scan-testable machine comprising:
a set of scan latches, wherein the set is partitioned into two or more unique initialization groups, each latch being assigned to one or more of the initialization groups; and
group addressing and initializing means, operatively coupled to the set of latches, for synchronously addressing each initialization group as a group and by so addressing a given initialization group, initializing the latches of the addressed group to a predefined initialization state.

2. A scan-testable machine as in claim 1 wherein:
said addressing and initializing means resets all the latches of an addressed group to a logic zero state by addressing that group.

3. A scan-testable machine as in claim 1 further comprising an integrated circuit substrate for supporting an integrated circuit,
wherein the integrated circuit includes a clock distribution network and network switching means for selectively passing a clock signal from a primary clock line of said network to a secondary clock line when said switch means is in a first state and for suppressing the passage of the clock signal from the primary clock line to the secondary clock line when said switch means is in a second state,
wherein a first subset of one or more said scan latches is formed on said substrate and the latches of said first subset are clocked by clock signals carried on said secondary clock line,
wherein a second subset of one or more of said scan latches is formed on said first substrate and each latch in said second subset defines an operating state latch which is not clocked by the clock signals which clock the latches of the first subset,
wherein one or more of said operating state latches is operatively coupled to select the state of said network switching means, and
wherein at least one of said initialization groups corresponds to said second subset so that the one or more operating state latches of said second subset are initialized by addressing said at least one initialization group.

4. A scan-testable machine as in claim 1 further comprising an integrated circuit substrate for supporting an integrated circuit,
   wherein the integrated circuit includes a memory block having addressable memory cells, and an address receiving port for receiving address signals which address the memory cells in the memory block,
   wherein a first subset of said scan latches is formed on said substrate to define a memory address register that is coupled to the address receiving port of said memory block for supplying address signals thereto, and
   wherein at least a first one of said initialization groups comprises said first subset of scan latches so that said memory address register is initialized by addressing said at least one of said initialization groups.

5. A scan-testable machine as in claim 4
   wherein the memory block further comprises a data receiving port for receiving data for storage in said memory cells,
   wherein a second subset of said scan latches is formed on said substrate to define a data input register that is coupled to the data receiving port of said memory block for supplying data signals thereto, and
   wherein at least a second one of said initialization groups comprises said second subset of scan latches so that said data input register is initialized by addressing said at least second one of said initialization groups.

6. A scan-testable machine as in claim 1 further comprising:
   latch addressing means for addressing each of the latches in said set individually with a unique address selected from a predefined series of addresses,
   wherein said series is subdivided into plural subseries each containing a predefined number of the addresses in said series, and
   wherein said set of scan latches is partitioned into two or more general initialization groups and wherein each general initialization group is an initialization group that corresponds to one of said subseries of unique addresses but has a different unique address selected from the predefined series of addresses, thereby enabling the group addressing and initializing means to initialize the latches of each general initialization group to a predefined initialization state by uniquely addressing that general initialization group.

7. A scan-testable machine as in claim 6 wherein the number of addresses in each of said subseries is equal to $2^m$, m being an integer greater than 4.

8. A scan-testable machine as in claim 7 wherein the number of addresses in each of said subseries is equal to the number of bits which can be stored by a memory unit of an external vector-loading engine which is operatively coupled to load test vector bits stored within said memory unit into said scan-testable machine.

9. A scan-testable machine as in claim 1 further comprising:
   latch addressing means for addressing each of the latches in said set of scan latches individually each with a unique address selected from a predefined series of addresses,
   wherein said series of addresses in subdivided into plural subseries each containing a predefined subset of the addresses in said series,
   wherein at least one subset is a functional subset which includes the individual addresses of functionally related scan latches, said functionally related scan latches being ones associated with a prespecified operation of the scan-testable machine; and
   wherein said set of scan latches is partitioned to include at least one functional initialization group, the at least one functional initialization group being an initialization group that corresponds to said at least one functional subset of unique addresses, the functional initialization group having a unique address selected from the predefined series of addresses;
   whereby the unique address of the at least one functional initialization group enables the group addressing and initialization means to initialize the latches of the at least one functional initialization group to a predefined initialization state by uniquely addressing that functional initialization group.

10. The scan-testable machine of claim 9,
    wherein the scan-testable machine is partitioned into separable compartments, each of which may be switched into a non-operational scan mode for scanning that compartment while other compartments continue to operate; and
    wherein at least one initialization group operates to switch a corresponding one of the separable compartments into the non-operational scan mode when the one initialization group is addressed by said group addressing and initializing means.

11. The scan-testable machine of claim 9,
    wherein the scan-testable machine includes one or more scannable counters formed by said scan latches; and
    wherein at least one initialization group operates to initialize a corresponding one or more of the scannable counters to a desired initialized state when the one initialization group is addressed by said group addressing and initializing means.

12. The scan-testable machine of claim 9,
    wherein the scan-testable machine comprises a plurality of circuit packages each containing operational circuitry of the scan-testable machine;
    wherein two or more of the subsets of said series of addresses are each a functional subset which includes the individual addresses of functionally related scan latches, said functionally related scan latches of each functional subset being ones associated with a prespecified one or more of plural prespecified operations of the scan-testable machine; and
    wherein said two or more functional subsets are partitioned into package-specific initialization addresses and machine-generic initialization addresses, the machine-generic initialization addresses being reserved for application to all packages of the scan-testable machine irrespective of internal circuit design of any given package, and the package-specific initialization addresses being individualized for application to specific packages in accordance with the internal circuit designs of such specific packages.

13. The scan-testable machine of claim 12,
    wherein plural packages of the scan-testable machine include strobable memory units responsive to supplied strobe pulses;

wherein the functionally related scan latches of one functional subset are associated with a prespecified strobe operation of the scan-testable machine; said strobe operation causing strobe pulses to issue to preselected ones of the strobable memory units of the scan-testable machine; and wherein said one functional subset has a corresponding functional initialization group that is assigned a machine-generic initialization address.

14. A scan-testable machine as in claim 1 further comprising a first integrated circuit substrate for supporting a first integrated circuit, wherein the first integrated circuit is composed of subcircuits, wherein at least one of said scan latches is defined on said first substrate for operatively coupling a first subcircuit of said first substrate to a second subcircuit of said first substrate, and wherein at least one part of said group addressing and initializing means is defined on said first substrate, the one part including:

address receiving means for receiving an address signal from a source outside the first substrate; and address decoding means, coupled to the address receiving means, for decoding a received address signal to determine whether or not the received address signal addresses an initialization group to which the at least one scan latch defined on said first substrate belongs.

15. The scan-testable machine of claim 14 wherein the address receiving means includes serial-to-parallel converting means for converting an address signal that is received in serial form from the outside source into parallel form and supplying the parallel form to the address decoding means.

16. A scan-testable machine as in claim 14 further comprising a circuit board for supporting said first integrated circuit substrate and at least one other integrated circuit substrate, wherein said set of scan latches is partitioned into a first subset defined on said first integrated circuit substrate and a second subset defined on said at least one other integrated circuit substrate, wherein at least one of the unique initialization groups has latches of either the second subset or both of the first and second subsets as members, wherein the at least one other integrated circuit substrate has a second integrated circuit which is composed of subcircuits and one or more scan latches of the second subset operatively coupling one subcircuit to the next, and wherein at least part of said group addressing and initializing means is operatively coupled to the second subset of latches, for addressing as a group each initialization group having latches of the second subset as members, and by so addressing a given initialization group having latches of the second subset as members, initializing the latches of the addressed group that belong to the second subset to a predefined initialization state.

17. A scan-testable machine as in claim 16, wherein at least a second part of said group addressing and initializing means is defined on said at least one other integrated circuit substrate, the second part including:

second address receiving means for receiving an address signal from a source outside the second substrate; and second address decoding means, coupled to the second address receiving means, for decoding a received address signal to determine whether or not the received address signal addresses an initialization group to which the at least one scan latch defined on said second substrate belongs.

18. A scan-testable machine as in claim 16 wherein said first and second subsets of scan latches are assigned to a global initialization group which comprises all the scan latches of the set, and wherein said group addressing and initializing means includes a global initializing means for addressing the global initialization group, and by so addressing the global initialization group, initializing all the scan latches in said first and second subsets.

19. A scan-testable machine as in claim 16 further comprising:

a frame for supporting the first said circuit board and at least one other similarly constructed circuit board, said frame including a scan distribution bus for receiving scan address signals issued from an external service processor and distributing said scan address signals to the group addressing and initializing means, at least one of said scan address signals addressing a multi-board initialization group which has as members, scan latches supported on different ones of said circuit boards, and by so addressing the multi-board initialization group, initializing the member scan latches that are supported on the different ones of said circuit boards.

20. A scan-testable machine comprising:

a set of scan latches, wherein the set is partitioned into two or more unique initialization groups, each latch being assigned to one or more of the initialization groups; and group addressing and initializing means, operatively coupled to the set of latches, for addressing each initialization group and initializing the latches of the addressed group to a predefined initialization state;

wherein said addressing and initializing means comprises:

a first plurality of address designating lines each designating a unique address within a predefined address space;

a second plurality of group-defining lines each connected to one of said address designating lines; and one or more logical OR gates each receiving two or more of said group-defining lines as input lines, each logical OR gate having an output terminal operatively coupled to one of said scan latches for initializing the scan latch.

21. A scan-testable machine as in claim 20 wherein said addressing and initializing means further comprises:

address decoding means having an input port for receiving a first plural number, n, of address defining bits which define a scan address in said address space and an output port for activating a corresponding address designating line in said first plurality of address designating lines, wherein the number of address designating lines in said scan-testable machine is more than one of less than $2^n$.

22. A scan-testable machine as in claim 21 wherein the first number n is greater than 8 and the number of address designating lines in said scan-testable machine is more than one but less than 12% of $2^n$.

23. A scan-testable machine as in claim 21 wherein the number of address designating lines in said scan-testable machine is more than one and less than sixty-four.

24. A scan-testable machine as in claim 23 wherein the number of address designating lines in said scan-testable machine is more than seven and less than thirty-three.

25. A method for loading a test vector into a preselected group of scan latches within a set having a larger number of individually addressable scan latches comprising:
   synchronously addressing the latches of the preselected group collectively; and
   as a result of the addressing step alone, resetting or setting the preselected latches collectively while leaving other latches of said set undisturbed.

26. The method of claim 25 further comprising after said resetting or setting step the further step of opposingly setting or resetting predefined ones of the collectively reset or set latches individually.

27. The method of claim 25 further comprising the steps of:
   dividing the set of scan latches into unique subsets each having an equal number of individually addressable scan latches, and
   selecting one of said subsets as the preselected latches which are to be collectively set or reset.

28. The method of claim 25 wherein said preselected group of latches define a data register for storing bits representing a data word of a predefined bit length.

29. The method of claim 25 wherein the preselected group of latches includes one or more operating state latches for configuring a clocked programmable machine to operate in a predefined mode, said operating state latches being latches which do not switch state in direct response to a clock of the clocked programmable machine.

30. The method of claim 25 further comprising after said resetting or setting step the further steps of:
   identifying those particular scan latches that have to be opposingly set or reset in order to establish said test vector in the preselected group of scan latches; and
   individually addressing and opposingly setting or resetting the identified scan latches to thereby establish said test vector.

31. The method of claim 25 wherein said set of scan latches are defined on a semiconductor substrate which further includes a plurality of subcircuits operatively coupled to one another through a first subset of said scan lathes, said method further comprising the steps of:
   forming group addressing means on said substrate for addressing the latches of said first subset collectively as a group and for thereby initializing the first subset of latches to predefined set or reset states.

32. The method of claim 31 wherein said group addressing means includes a plurality of address designating lines crossing with a plurality of group-defining lines, wherein the address designating lines are individually activated when the group addressing means receives a corresponding scan address signal representing a unique address in a predefined address space and wherein the group defining lines are operatively coupled to each initialized one or a second subset of the scan latches of said set, the method further comprising the step of:
   selectively forming interconnections between the address designating lines and the group-defining lines to thereby assign a group initializing address to said preselected group of latches.

33. A method for loading a series of different test vectors into a set of scan latches provided within a system under test where the scan latches are operatively coupled to apply stimulus signals to subcircuits within the system under test, the method comprising the steps of:
   (a) dividing said st of scan latches into uniquely identifiable groups of at least two latches each;
   (b) addressing one of said groups and driving all the latches of the addressed group in unison to predefined states;
   (c) individually addressing one or more of the latches of the addressed group and driving each individually addressed latch to a state opposite the predefined state it was driven to in step (b);
   (d) detecting a response of a corresponding one or more subcircuits to a stimulus condition defined by steps (b) and (c); and
   (e) repeating steps (b), (c) and (d) while modifying either or both the identity of the group addressed in step (b) and the identity of scan latches individually addressed in step (c).

34. A loading method as in claim 33 wherein the predefined states of step (b) each represent a logic zero and each opposing state of step (c) represents a logic one.

35. A loading method as in claim 33 wherein the system under test has a predefined time limit during which a continuous series of test vectors may be loaded, wherein steps (b) through (e) define a complete test sequence and wherein said complete test sequence is performed within said time limit.

36. The loading method of claim 35 wherein said time limit is 800 milliseconds or less.

37. A scannable computer comprising:
   a plurality of function units which may operate independently or in cooperation with one another, each of said function units having:
   (a) a plurality of subcircuits coupled to define a complete circuit which performs a function of the function unit;
   (b) a set of clocked scan latches operatively coupled to said subcircuits for temporarily decoupling said subcircuits one from the other and applying test stimulus signals to the subcircuits; and
   (c) operating state control means for controlling delivery of clock signals to the clocked scan latches, said clock signals being delivered to the scan latches in a normal operating mode and being not delivered to the scan latches in a test mode; and
   test control means, coupled to the operating state control means of each function unit, for addressing each function unit and placing the addressed function unit in either a normal operating mode or a test mode,
   wherein said test control means further includes group addressing and initializing means for synchronously addressing unique groups of clocked scan latches each as a group in those of said function units which are in a test mode and by so addressing each of the unique groups, driving the clocked scan latches of each addressed group in unison to predefined initialization states thereby defining a subset of the test stimulus signals applied to the subcircuits of the function units which are in test mode.

38. A scannable computer as in claim 37 further comprising a plurality of integrated circuits wherein at least one of said integrated circuits includes subcircuits and clocked scan latches belonging to a first and a second of said function units and wherein the at least one of said integrated circuits includes first and second operating state latch means for controlling delivery of clock signals respectively and independently to the clocked scan latches of the first and second function units so that one of said first and second function units can continue to operate in normal mode while the other is in test mode.

* * * * *

UNITED STATES PATENT AND TRADEMARK OFFICE
CERTIFICATE OF CORRECTION

PATENT NO. : 5,271,019

DATED : December 14, 1993

INVENTOR(S) : Robert Edwards et al.

It is certified that error appears in the above-identified patent and that said Letters Patent is hereby corrected as shown below:

```
Column 26, line 17, "initialization" should be --initializing--.
Column 29, line 48, "lathes" should be --latches--.
Column 30, line 7, "st" should be --set--.
```

Signed and Sealed this

Twentieth Day of February, 1996

Attest:

BRUCE LEHMAN

*Attesting Officer*  *Commissioner of Patents and Trademarks*